(12) United States Patent
Ingelberts

(10) Patent No.: US 11,081,509 B2
(45) Date of Patent: Aug. 3, 2021

(54) DETECTOR FOR FAST-GATED DETECTION OF ELECTROMAGNETIC RADIATION

(71) Applicant: VRIJE UNIVERSITEIT BRUSSEL, Brussels (BE)

(72) Inventor: Hans Ingelberts, Brussels (BE)

(73) Assignee: VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 16/611,326

(22) PCT Filed: May 8, 2018

(86) PCT No.: PCT/EP2018/061928
§ 371 (c)(1),
(2) Date: Nov. 6, 2019

(87) PCT Pub. No.: WO2018/206606
PCT Pub. Date: Nov. 15, 2018

(65) Prior Publication Data
US 2020/0168649 A1   May 28, 2020

Related U.S. Application Data

(60) Provisional application No. 62/502,967, filed on May 8, 2017.

(30) Foreign Application Priority Data

Jul. 20, 2017  (EP) .................................... 17182417

(51) Int. Cl.
*H01L 27/146* (2006.01)
(52) U.S. Cl.
CPC .. *H01L 27/14614* (2013.01); *H01L 27/14603* (2013.01)

(58) Field of Classification Search
CPC .................... H01L 27/14614; H01L 27/14603
(Continued)

(56) References Cited

U.S. PATENT DOCUMENTS

2003/0173581 A1\* 9/2003 Blanchard ........... H01L 27/1446
257/183
2008/0277717 A1   11/2008 Stein Von Kamienski

FOREIGN PATENT DOCUMENTS

| EP | 2330637 A2 | 6/2011 |
|---|---|---|
| EP | 3010227 A1 | 4/2016 |
| JP | 2013089873 A | 5/2013 |

OTHER PUBLICATIONS

H. Ingelberts et al, "A current-assisted CMOS photonic sampler with two taps for fluorescence lifetime sensing", Proc. of SPIE, vol. 9896, p. 98960Y-1-98960Y-7, 2016 (Year: 2016).\*

(Continued)

*Primary Examiner* — Tong-Ho Kim
(74) *Attorney, Agent, or Firm* — Workman Nydegger

(57) ABSTRACT

A detector device for detection of electromagnetic radiation impinging on a substrate and generating pairs of majority and minority charge carriers in the substrate, comprises at least one minority charge detection structure for, in a first mode, injecting a majority current so as to create an electric field for directing minority charge carriers towards the at least one minority charge detection structure for detecting minority charge carriers generated in the substrate; two or more minority charge removal structures per minority charge detection structure for, in a second mode, injecting a majority current so as to create an electric field, for draining minority charge carriers towards the two or more minority charge removal structures, away from the associated charge detection structure; and at least one substrate majority charge current sink for extracting the injected majority current.

13 Claims, 6 Drawing Sheets

(58) Field of Classification Search
USPC .......................................................... 257/222
See application file for complete search history.

(56) References Cited

OTHER PUBLICATIONS

Van Nieuwenhove et al., "Photonic Demodulator With Sensitivity Control", IEEE Sensors Journal, vol. 7, No. 3, Mar. 2007, 2 Pages.
Han et al., "A CMOS Time-of-Flight Range Image Sensor Using Draining Only Modulation Structure", Image Sensors and Imaging Systems, vol. 9022, 2014, 6 Pages.
Ingelberts et al., "High-Speed Gated CMOS Detector for Fluorescence Lifetime Microscopy Extending to Near-Infrared Wavelengths", IEEE, 2015, 4 Pages.
Ingelberts et al., "A Current-Assisted CMOS Photonic Sampler with Two Taps for Fluorescence Lifetime Sensing", SPIE, vol. 9896, 2016, 7 Pages.
European Search Report from EP Application No. EP17182417, dated Feb. 1, 2018.
International Search Report & Written Opinion from PCT Application No. PCT/EP2018/061928, dated Jul. 17, 2018.

* cited by examiner

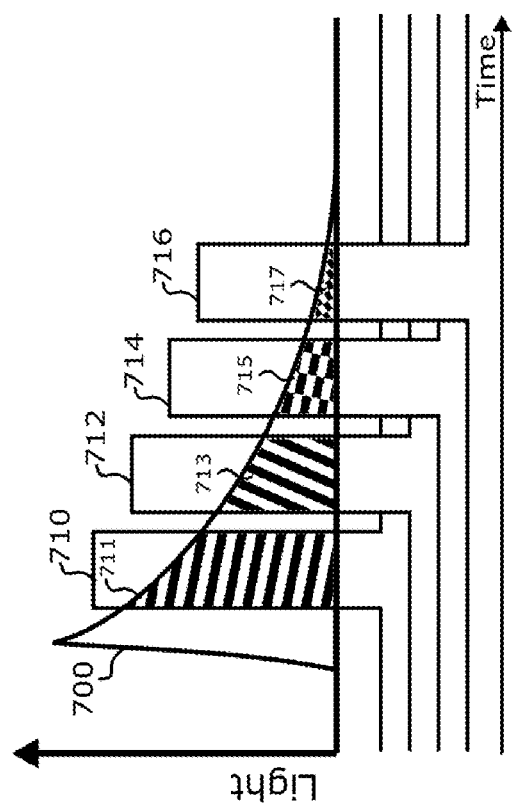
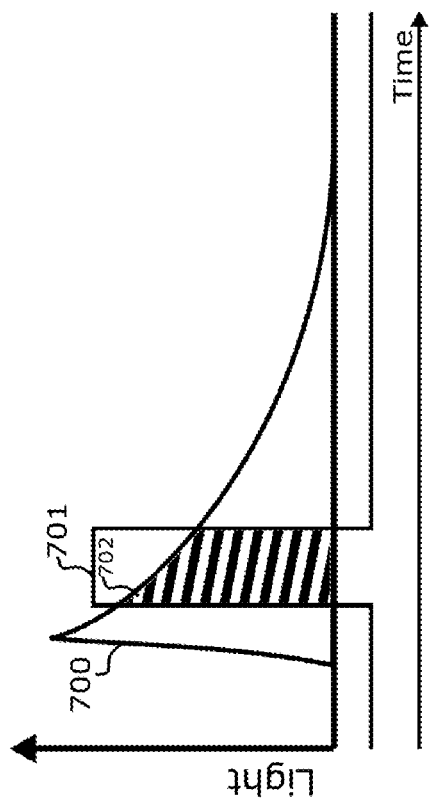

DETECTOR FOR FAST-GATED DETECTION OF ELECTROMAGNETIC RADIATION

TECHNICAL FIELD OF THE INVENTION

The present invention relates to the field of detection of electromagnetic radiation that generates minority carriers in a semiconductor substrate, such as for instance, but not limited thereto, detection of visible and infrared light. More particularly, the present invention relates to gated detection of electromagnetic radiation, mainly in the visible and NIR light.

BACKGROUND OF THE INVENTION

EP1513202B1 describes semiconductor detectors that apply a majority carrier current to generate a drift field for demodulation of incoming light. IEEE sensors journal Vol 7, NO. 3, pp 317-318 "Photonic demodulator with sensitivity control" describes a drain tap that is able to drop demodulation sensitivity to 1% when applying a biasing to the tap of 3.3V.

Document "A current-assisted CMOS photonic sampler with two taps for fluorescence lifetime sensing", Proceedings optical diagnostics of living cells II, SPIE, US vol. 9896, 98960Y, 29 Apr. 2016 (2016-04-29) by Ingelberts H et al, describes a detector structure with two charge detection structures and a structure consisting of a single drain and midring, for removing charges. The speed and compactness of such detectors can be improved.

SUMMARY OF THE INVENTION

It is an object of the present invention to provide a good device for detection of electromagnetic radiation.

The above objective is accomplished by a detector device for detection of electromagnetic radiation impinging on a substrate, whereby the impinging radiation generates pairs of majority and minority charge carriers in the substrate. The detector device comprises at least one minority charge detection structure for detecting minority charge carriers generated in the substrate and for, in a first mode, injecting a majority current so as to create an electric field for directing minority charge carriers towards the at least one minority charge detection structure; two or more minority charge removal structures associated to each minority charge detection structure, e.g. two or more removal structures per detection structures, for draining away minority charge carriers and for, in a second mode; injecting a majority current so as to create an electric field, for directing minority charge carriers towards the two or more minority charge removal structures, away from the associated charge detection structure; and at least one substrate majority charge current sink for extracting the majority current. It is an advantage of embodiments of the present invention that fast-gated detection may be achieved. This fast-gated detection is achieved by changing a majority current flow between contacts, so that the corresponding minority charge carriers are either directed towards the minority charge detection structure or directed away from the minority charge detection structure and towards the minority charge removal structures, that can be optimized for fast removal because they only need to remove minority carriers and not detect them.

In a detector device according to embodiments of the present invention, the at least one minority charge detection structure may comprise a doped region of a first conductivity type (e.g. p-type), a doped region of a second conductivity type (e.g. n-type) different from the first conductivity type, the doped region of the second conductivity type being close to the doped region of the first conductivity type, and forming a pn junction with the substrate, the doped region of the first conductivity type being electrically contacted by a majority charge contact for injecting or extracting majority currents (e.g. generated by majority charge carriers) in or from the substrate, so as to create an electric field for directing the minority charge carriers towards the doped region of the second conductivity type for readout of detected charge carriers.

In a detector device according to embodiments of the present invention, the minority charge removal structures comprise a doped region of a first conductivity type (e.g. p-type), a doped region of a second conductivity type (e.g. n-type) different from the first conductivity type, the doped region of the second conductivity type being close to the doped region of the first conductivity type, and forming a pn junction with the substrate and a common terminal short-circuiting the formed pn junction. In particular embodiments, the common terminal may comprise a common contact to the doped region of the first conductivity type and to the doped region of the second conductivity type. A terminal is an electrical connection to the outside of the detector. The common terminal as in embodiments of the present invention makes the detector device a very compact one.

In a detector device according to embodiments of the present invention, the at least one substrate majority charge current sink may comprise a conductive structure surrounding the at least one minority charge detection structure and the two or more minority charge removal structures, for example a ring-shaped conductive structure, e.g. a single conductive ring.

In a detector device according to embodiments of the present invention, the at least one minority charge detection structure and the two or more minority charge removal structures are provided at the top surface of the detector device. In embodiments of the present invention, the at least one substrate majority charge current sink may comprise a conductive structure at the bottom of the detector device, on a surface opposite to the top surface.

A detector device according to embodiments of the present invention may comprise a plurality of minority charge detection structures and a plurality of minority charge removal structures. In embodiments of the present invention, at least two of the plurality of minority charge detection structures may share at least one of the minority charge removal structures.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIGS. 3B and 3D are cross sections through line I-I' and II-IF of FIGS. 3A and 3C, respectively.

FIGS. 7A and 7B show how incident light signals can be sampled using the fast-gated detectors according to embodiments of the present invention.

Figure 1A:
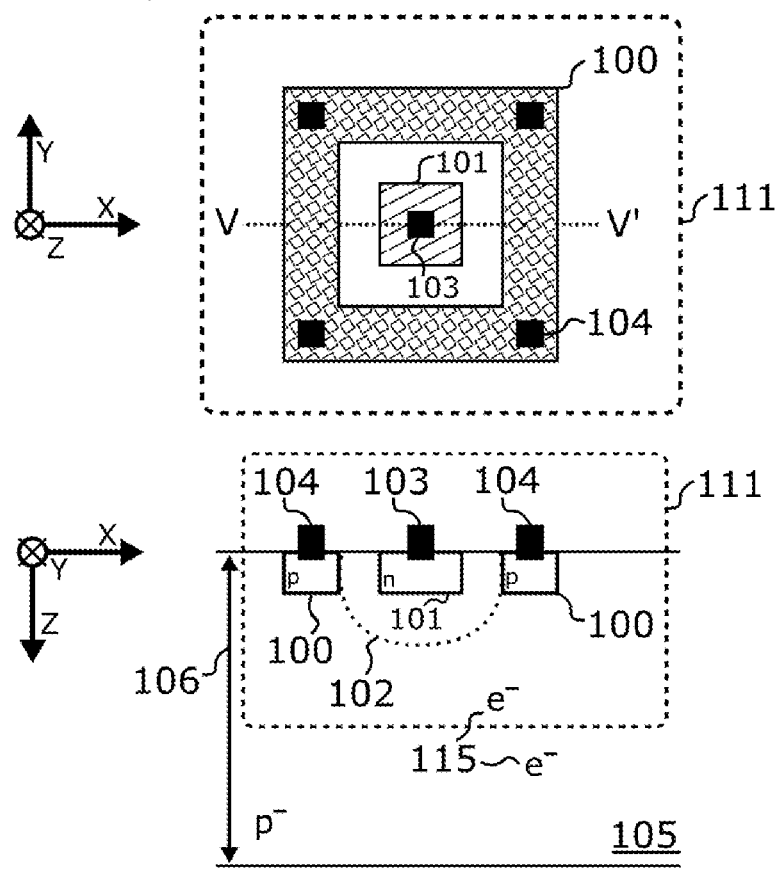
FIG. 1A shows a top view and a cross-section of a known minority charge detection structure, which may be used in a fast-gated detector according to embodiments of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention. In the different figures, the same reference numbers refer to the same or analogous elements.

DETAILED DESCRIPTION OF THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter. Thus, the scope of the expression "a device comprising means A and B" should not be limited to devices consisting only of components A and B. It means that with respect to the present invention, the most relevant components of the device are A and B.

Similarly, it is to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

In the context of the present invention, the term "p-diffusion or n-diffusion" refers to a volume where there has been applied a specific change in doping level and/or doping type compared to the original substrate. The way that this has been achieved, e.g. in a CMOS foundry, is not critical for the present invention. It can have been done by diffusion, but also by implant, or by epitaxial layer growth, or whatever technique may be used to get this result.

In the present disclosure, reference is made to a first conductivity type that is p, and a second conductivity type that is n. The opposite configuration is also possible (first conductivity type n and second conductivity type p); however, the chosen configuration is preferred because the minority charge carriers will be of the second conductivity type and thus will be n-type. Electrons have a higher mobility than holes, making the detector intrinsically faster. A person skilled-in-the-art can easily implement the findings of the present disclosure by using the opposite configuration. However, for the clarity and understanding in the specification further only the fastest option is described.

In the following, the terms "minority charge detection structure" and "minority charge detector structure" are interchangeable.

The fast-gated detectors of embodiments of the present invention have several parts. For each fast-gated detector there is at least one minority charge detection structure 111, 112, for instance as disclosed with respect to FIG. 1A or FIG. 1B, supported by two or more minority charge removal structures 210, 211, and at least one substrate majority current sink 305 altogether embedded in a lowly doped substrate 105. To achieve fast-gated detection, the constituting elements of the fast-gated detector must follow certain topology rules.

At least two minority charge removal structures 210, 211 can be functionally linked or associated to one minority detection structure 111, 112. With "functionally linked" or "associated" is meant that the structures can interact directly with each other, e.g. they can be biased so that electric field lines can be generated between them, and charge carriers can travel between these structures. The minority charge removal structures 210, 211 may be distributed on the substrate around a minority charge detection structure 111, 112, forming discrete islands. For example, each minority charge detection structure 111, 112 may have at least two minority charge removal structures 210, 211 nearby, for example neighboring it, for example being separated only by portions of the substrate 307. The distribution of structures on the substrate can be tailored to improve the speed of ON/OFF transitions.

In other words, charge removal is associated with charge detection; the removal structures remove charge that may otherwise be detected. Every charge detection structure has at least two charge removal structures associated to it, speeding up the charge removal and facilitating complete removal.

In some embodiments, the discrete minority charge removal structures 210, 211 may be placed in between the minority detection structure 111, 112 and a substrate majority current sink 305, for example a single ring-shaped structure serving as substrate majority current sink 305, surrounding the detection and removal structures. This further contributes to speed increase.

Figure 1B:
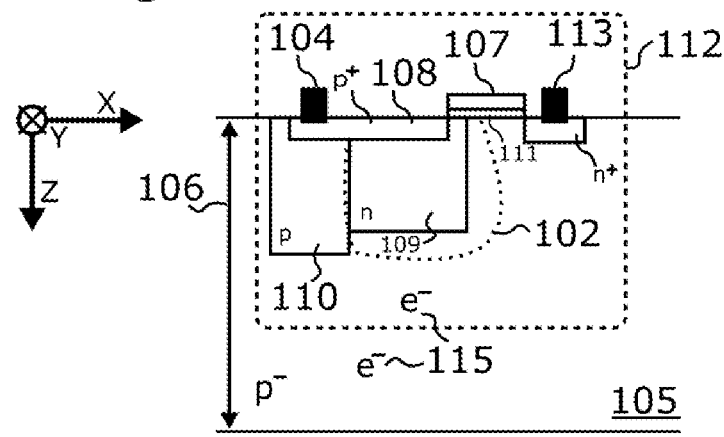
FIG. 1B shows a cross-section of known minority charge detection structure based on a pinned pn-junction, which may be used in a fast-gated detector according to embodiments of the present invention.

FIG. 1A and FIG. 1B describe two minority charge detection structures 111, 112 that are known in the state of the art. FIG. 1A shows a minority charge detection structure 111 that is particularly well-suited for being used in a fast-gated detector according to embodiments of the present invention. The top part of FIG. 1A shows a top view of the minority charge detection structure 111, while the bottom part of FIG. 1A illustrates a cross-section according to line V-V'. The minority charge detection structure 111 comprises a substrate 105 with thickness 106. It has a p-doped region, e.g. a p-diffusion 100, forming a closed structure with a hole, e.g. a central hole, such as for example, however not being limited thereto, a structure having an annular shape, or a squared donut shape. The p-doped region, e.g. p-diffusion 100, is contacted by one or more majority charge contact(s) 104. Close to the p-doped region, e.g. p-diffusion, in the hole of the closed structure, e.g. in the center of the annular or donut shape, there is also an n-doped region, e.g. an n-diffusion 101, that forms a pn-junction with the p⁻-substrate 105 generating depletion layer 102. The p-doped region, e.g. p-diffusion 100, is in the p⁻-substrate 105 and has a higher doping level than the substrate. Majority carriers, in this case holes, can freely flow from the p-doped region, e.g. p-diffusion 100, to the p⁻-substrate 105 and vice versa because both regions are of the same p-conductivity type. The n-doped region, e.g. n-diffusion 101, is contacted by minority charge contact 103. The p-doped region, e.g. p-diffusion 100, n-doped region, e.g. n-diffusion 101, can have a source, drain, p-well or n-well doping profile inherited from a standard CMOS or BICMOS process, or can be specifically tuned to the designer's preference.

The majority charge contact 104 can be used for injecting or extracting majority charge carriers in or from the substrate 105, so as to create a majority current. This majority current creates an electric field in the substrate 105.

More in detail, through majority charge contact(s) 104, injection of a majority current into the substrate 105 is possible through the p-doped region, e.g. p-diffusion 100, thereby creating an electric field in the p⁻-substrate 105 that attracts minority charge carriers 115 (electrons in this case) in the p⁻-substrate 105 towards the p-doped region, e.g. p-diffusion 100, from where these minority charge carriers diffuse towards the depletion layer 102. Once having passed the depletion layer 102, they reach the n-doped region, e.g. n-diffusion 101, and one can say that then the minority charge carriers are getting detected over the pn-junction between n-doped region, e.g. n-diffusion 101, and p⁻-substrate 105. The minority charge carriers 115 can originate from thermal generation, photo-generation, or any other mechanism that provides minority carriers in the substrate 105.

Conversely, through majority charge contact(s) 104, extraction of majority charge carriers from the substrate 105 is possible through the p-doped region, e.g. p-diffusion 100, thereby creating an opposite electric field in the p⁻-substrate 105 that repels minority charge carriers 115 in the p⁻-substrate 105 away from the p-doped region, e.g. p-diffusion 100, and also away from the depletion layer 102, due to which the minority charge carriers 115 are not reaching the n-doped region, e.g. n-diffusion 101, and are not getting detected over the pn-junction between n-doped region, e.g. n-diffusion 101 and p⁻-substrate 105. Minority charge contact 103 contacts n-doped region, e.g. n-diffusion 101, to allow read-out circuitry (not shown) to be subsequently connected. There are several read-out circuits possible, including the well-known 3T-transistor circuit, transimpedance amplifier etc . . . .

FIG. 1B shows a cross-sectional view of an alternative minority charge detection structure 112, of the pinned-type, which may be used in an alternative fast-gated detector according to embodiments of the present invention. The minority charge detection structure 112 comprises a substrate 105 with thickness 106. It has also majority charge contact(s) 104 connected to a first p-doped region, e.g. p-diffusion 110, a nearby n-doped region, e.g. n-diffusion 109, that forms a pn-junction with the second p-doped region, e.g. p⁺-diffusion 108, on top, with the first p-doped region, e.g. p-diffusion 110, at the side, and with the p⁻-substrate 105 below. The gate 107 on top of oxide 111 forms a transistor which can be the first transistor in a classical four transistor (4T) read-out structure in a CMOS image sensor as known by a person skilled-in-the-art. The use of 4T in image sensors has the advantage to reach a better signal-to-noise ratio. Similar as in minority charge detection structure 111 of FIG. 1A, insertion or extraction of majority current to the p⁻-substrate 105, via the majority charge contact(s) 104, respectively attracts or repels minority charge carriers 115 in the p⁻-substrate 105, thereby turning ON or OFF the detection of those charge carriers to the n-doped region, e.g. n-diffusion 109. The removal of the detected charge carriers in the n-doped region, e.g. n-diffusion 109, will now happen through a channel that can be formed under the gate 107 connecting the n-diffusion 109 with the contact 113 by applying a high voltage on gate 107. Subsequently, the rest of a read-out circuit (not illustrated in FIG. 1B) can be attached to contact 113.

In both minority charge detection structures 111, 112, the detection can be enabled (ON-state) or disabled (OFF-state) depending on the direction of the majority current through the majority charge contact(s) 104. When no majority current is applied, minority charge carriers that are wandering around may arrive at the n-diffusion 101, 109 and be detected. This is in-between ON and OFF, say the neutral state. It can be achieved by leaving majority charge contact(s) 104 floating or by biasing the voltage such that the majority current becomes zero. This can e.g. be used when the minority charge detection structure is not in use.

Figure 2B:
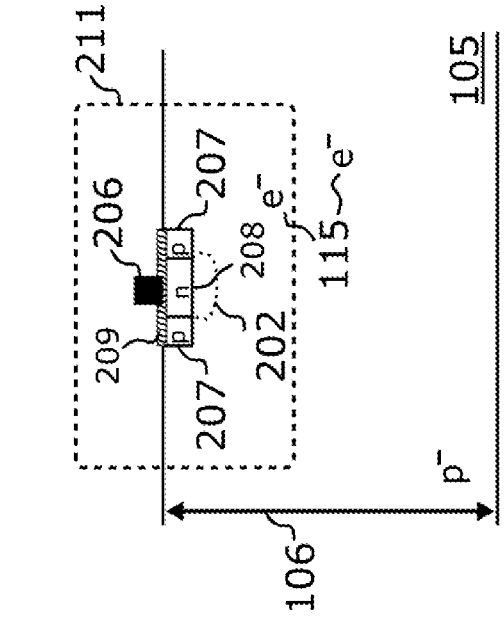
FIG. 2B shows a particular embodiment of a minority charge removal structure of the present invention, which may be used in a fast-gated detector according to embodiments of the present invention.
Figure 2A:
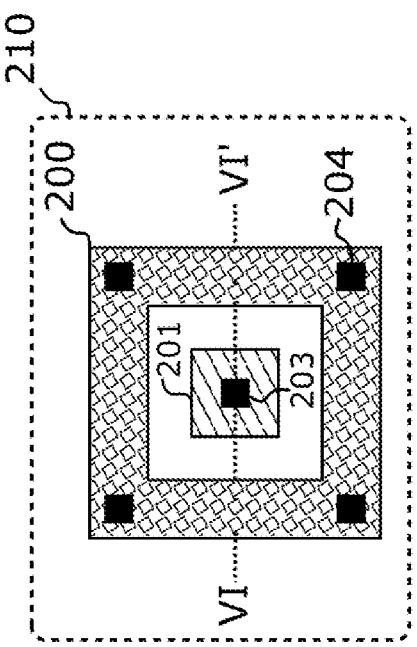
FIG. 2A shows a minority charge removal structure according to embodiments of the present invention, which may be used in a fast-gated detector according to embodiments of the present invention.

FIG. 2A and FIG. 2B describe two minority charge removal structures 210, 211 according to embodiments of the present invention.

The aim of the minority charge removal structures 210, 211 is to drain away minority charge carriers 115 in the underlying p⁻-substrate 105, when enabled, in a very quick and very efficient way. The drained minority charge carriers 115 do not have to be quantified. When minority charge removal structures 210, 211 are being disabled, the minority charge carriers 115 are not removed.

The minority charge removal structure 210 of FIG. 2A includes a terminal providing electrical contact to the outside of the detector. In particular, it includes a common terminal 205, providing the same electrical connection of different contacts 203, 204 to the exterior of the detector, short-circuiting said contacts; contacts, being a vertical conduction path (a vertical low resistivity path) between the semiconductor material and the first metalization layer of the chip. The minority charge removal structure 211 of FIG. 2B includes a horizontal conduction path (a horizontal low resistivity path). The horizontal conduction path may comprise a conductive layer 209 providing the same electrical connection between different doped regions 207, 208 and a single, common contact 206 serving as a single common terminal.

Other means of short-circuiting the diode of FIGS. 2A and 2B can be provided. The doped regions are preferably short-circuited to a source of common modulated or variable potential, rather than to a fixed potential, thus allowing different biasing.

FIG. 2A illustrates a first minority charge removal structure 210 according to embodiments of the present invention, which may be used in a fast-gated detector according to embodiments of the present invention. The top part of FIG. 2A shows a top view of the minority charge removal structure 210, while the bottom part of FIG. 2A illustrates a cross-section according to line VI-VI'. The minority charge detection structure 210 comprises a substrate 105 with thickness 106. Majority charge contacts 204 are connected to a p-doped region, e.g. p-diffusion 200, forming a closed structure with a hole, e.g. a central hole, such as for example, however not being limited thereto, a structure having an annular shape, or a squared donut shape. In the open hole of the closed structure formed by the p-doped region 200 is provided an n-doped region, e.g. n-diffusion 201, that is contacted by minority charge contact 203. It may be a centrally placed n-doped region. The n-doped region, e.g. n-diffusion 201, forms a diode with the p-doped region, e.g. p-diffusion 200, and with p$^-$-substrate 105, giving a depletion layer 202. The diode is short-circuited by short-circuit means, e.g. a common terminal 205, that connects majority charge contact(s) 204 with minority charge contact 203.

FIG. 2B illustrates a second minority charge removal structure 211 according to embodiments of the present invention, which may be used in a fast-gated detector according to embodiments of the present invention. The top part of FIG. 2B shows a top view of the minority charge removal structure 211, while the bottom part of FIG. 2B illustrates a cross-section according to line VII-VII'. The minority charge detection structure 211 comprises a substrate 105 with thickness 106. In this case, a p-doped region, e.g. p-diffusion 207, forming a closed structure with a hole, e.g. a central hole, such as for example, however not being limited thereto, a structure having an annular shape, or a squared donut shape, is abutted to the inner n-doped region, e.g. n-diffusion 208. The function of the p-diffusion 207 and n-diffusion 208 of FIG. 2B are analogous to the p-diffusion 200 and the n-diffusion 201 of FIG. 2A. Now there are several options to get to the wanted short-circuiting between those p and n-doped regions, e.g. diffusions. A first option is to have a conductive layer 209 on top that makes contact to both p and n-doped regions, e.g. diffusions, e.g. a common silicide layer 209 that is very metallic and conducting. Another option is that through the high doping levels of both types of doped regions, e.g. p and n-diffusions, there is a high level of tunneling and breakdown between them, in fact destroying normal diode behavior. Any (combination) of the different ways for short-circuiting is possible. Below the n-doped region, e.g. n-diffusion 208, there will nevertheless remain a depletion layer 202 with built-in diode voltage, which still has the capacity to attract and remove minority charge carriers 115 from the substrate 105. A common contact 206 can be placed that connects to both the diffusions 207, 208, this way making the minority charge removal structure 211 a very small one. The fact that both diffusions 207, 208 do not require a separate contact enables very compact charge removal structures, which is a very advantageous feature.

For both minority charge removal structures 210, 211, by applying a majority current into the common terminal 205, e.g. common contact 206, a majority current in the p$^-$-substrate 105 will flow, generating a drift field that attracts minority charge carriers 115, and that will end-up in the shorted pn diode that is formed by n-diffusion 201, 208, resp., with the p-diffusion 200, 207, resp., and with p$^-$-substrate 105. Due to the short-circuiting these charge carriers get effectively removed and are no longer available for detection elsewhere. Conversely, by extracting a majority current from the common terminal 205, e.g. common contact 206, a majority current in the p$^-$-substrate 105 will flow in the opposite direction, generating a drift field in the opposite direction that repels minority charge carriers 115 such that they will not be removed and will remain available for detection elsewhere. The smaller minority charge removal structure 211 as illustrated in FIG. 2B has a much faster and more efficient response time than minority charge removal structure 210 illustrated in FIG. 2A, due to the shorter distance that the minority charge carriers 115 have to travel from doped regions, e.g. diffusions, 207 to 208 compared to the distance between doped regions 200 and 201. Moreover, abutted pn-junctions such as the one of FIG. 2B allow a p doping width much smaller than with non-abutted junctions. The short-circuiting is achieved by using an abutted pn-junction resulting in a p doping width that is smaller than the width of non-abutted junctions. This narrow width has the advantage of providing a correspondingly short minority carrier travel time along the width. Thus, the charge removal structure construction method enables both a very compact minority charge removal structure 211 and a very narrow p doped region, shortening the charge travel time along this region. This increases the speed of the sensor.

Figure 3A:
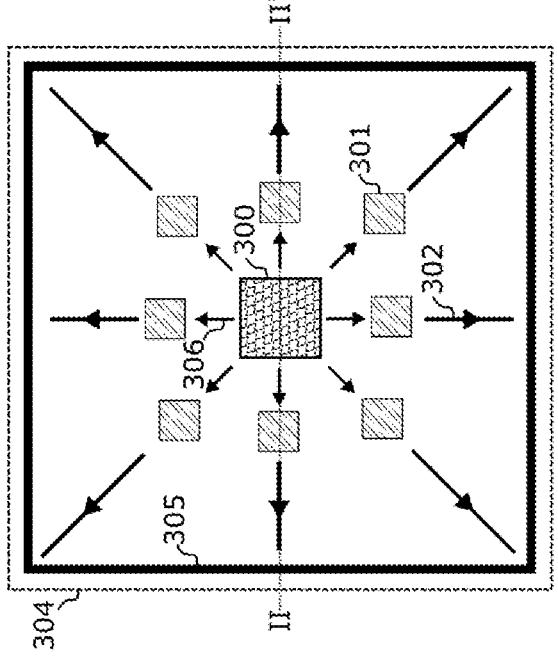
FIGS. 3A and 3B show a fast-gated detector in a state wherein photo-generated minority charge carriers get removed.
Figure 3B:
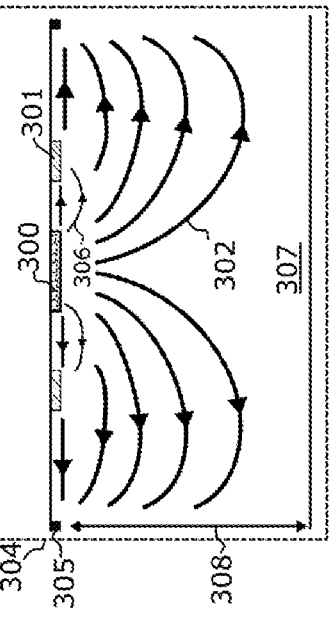
Figure 3C:
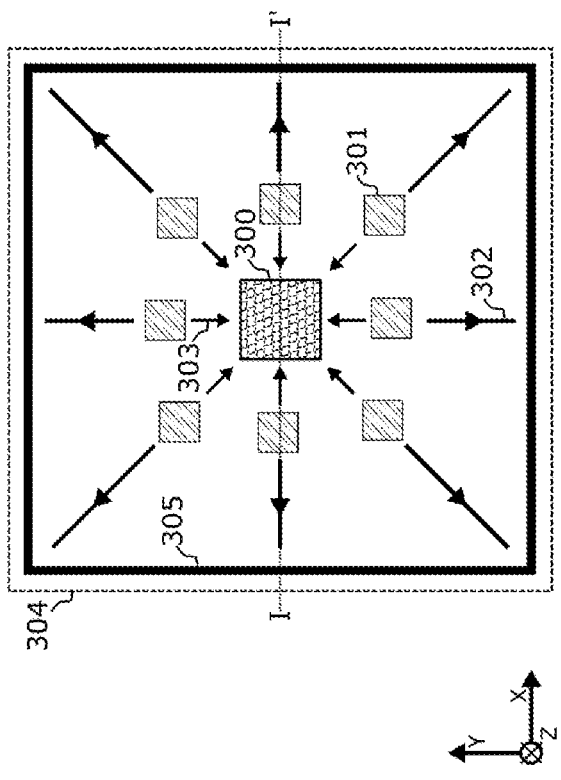
FIGS. 3C and 3D show the same in a state wherein they get detected according to the findings of the present invention.
Figure 3D:
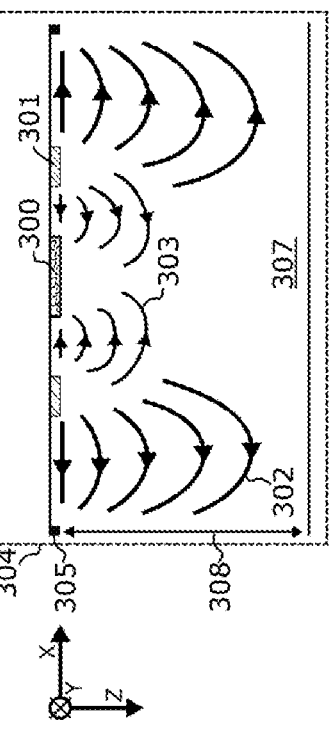

FIGS. 3A and 3C show the top views, and FIGS. 3B and 3D cross-sectional views according to lines I-I' and respectively, of fast-gated detectors 304 according to embodiments of the present invention. The detectors 304 are implemented in a substrate 307 with thickness 308. The squares 300 symbolize a minority charge detection structure as for instance minority charge detection structures 111, 112 as illustrated in FIG. 1A or FIG. 1B. The 8 squares 301 symbolize 8 minority charge removal structures as for instance minority charge removal structures 210, 211 as illustrated in FIG. 2A or FIG. 2B. The minority charge detection structure 300 and the minority charge removal structures 301 are implemented in a top surface of the substrate 307. There is a ring contact 305, e.g. a square ring contact, to the substrate 307 that serves as a substrate majority current sink 305. The ring contact 305 may be at a surface of the detector device, for instance at the surface where the charge detection and charge removal devices 300, 301 are provided. When the detector 304 is being operated (either in the ON or OFF state), this sink 305 will extract a remainder of the inserted but not yet extracted majority currents. Its location determines the field line behavior and consequently determines where the detective volume will be located.

FIGS. 3A and 3B show the condition whereby the photo-generated minority charge carriers in the substrate 307 get disposed of. For that, majority current is injected into the common terminal 205, e.g. common contact 206 (see FIG. 2A or 2B) of the 8 minority charge removal structures 301, and majority current gets extracted at the majority charge contact(s) 104 (see FIG. 1A or 1B) of the minority charge detection structure 300. The injected majority currents 302, 303 flow through the substrate 105 partly towards the substrate's majority sink 305 (currents 302), accepting (extracting, removing or sinking) these currents, and partly (currents 303) to the minority charge detection structure 300. The minority charge carriers will flow in the opposite direction and will get removed at the 8 minority charge removal structures 301.

The majority current situation can be changed quickly, and evenly quick, detection can be promoted (FIGS. 3C and 3D). For that, majority current is extracted from the common terminal 205, e.g. common contact 206 (see FIG. 2A or 2B) of the 8 minority charge removal structures 301, and majority current inserted at the majority charge contact(s) 104 of the minority charge detection structure 300. These latter majority currents 302, 306 flow through the substrate 307 partly towards the substrate majority current sink 305 (currents 302), accepting (extracting, removing or sinking) these currents, and partly to the 8 minority charge removal structures 301 (currents 306). Minority charge carriers will all flow in the opposite direction of the majority charge flow and will substantially all get detected and become available at the pn-junction of the minority charge detection structure 300 for later or immediate read-out.

Figure 4A:
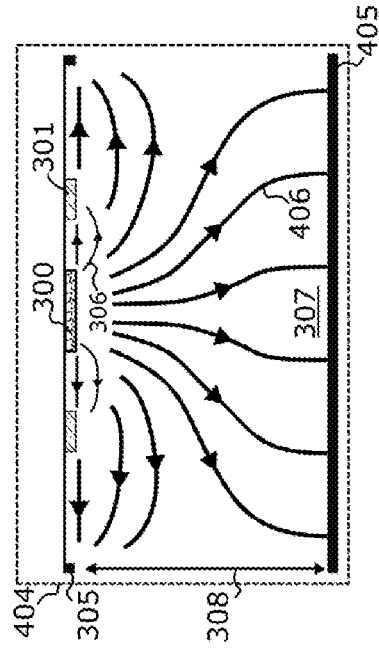
FIGS. 4A, and 4B, show cross-sections of similar structures as in FIGS. 3B and 3D, with an additional substrate majority current sink at the bottom of the detector.
Figure 4B:
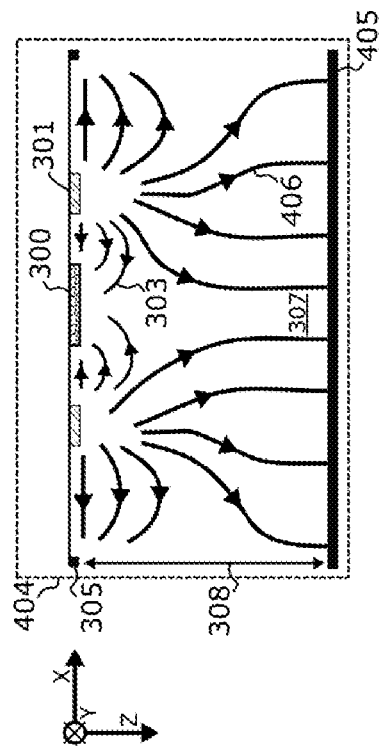

FIGS. 4A and 4B show a topology of a fast-gated detector 404 that is similar to the fast-gated detector 304 of FIG. 3. As in the detector of FIG. 3, the minority charge detection structure 300 and minority charge removal structures 301 are provided in a top surface of the substrate, but additional to a first substrate majority current sink 305 there is also a second substrate majority current sink 405, located at the bottom of the detector, e.g. at the surface of the substrate 307 opposite to the top surface, where the lowly doped substrate 307 stops (which may be surrounded by oxide, metal, air, material of different doping concentration, etc.). In this way, the majority current through the substrate can now end at substrate majority current sink 305 as well filling the detector volume with field lines 406 filling in a more homogeneous way. FIG. 4A, gives the OFF-state of the detection, and FIG. 4B gives the ON-state (sampling-state) of the detector. The second substrate majority current sink 405 may be any conductive surface at the bottom of the detector, for instance it may have the shape of a plane. Substrate majority current sink 305 is optional when a substrate majority current sink 405 is present at the bottom.

To get good and quick transitions between the ON— and OFF—states, it is preferable to have at least two minority charge removal structures 301 per minority detector structure 300. The two minority charge removal structures 301 may be located at opposite sides of the minority detector structure 300. If more than two minority charge removal structures 301 are provided per minority detector structure 300, they may be substantially evenly spread around the minority detector structure 300.

The at least two minority charge removal structures 301 should further be located nearby the minority detector structure 300. What is "nearby" depends on the distance to the closest part of the substrate majority current sink 305, 405. To reach acceptable speed, the at least two minority charge removal structures 301 should always be located closer to the minority detector structure 300, than to any part of the used substrate majority sink(s) 305, 405.

When there are multiple minority detector structures 300 in an array, minority charge removal structures 301 can be shared; however, each minority charge detector structure 300 needs to have at least two minority charge removal structures 301 nearby. For example, each minority charge detector structure 300 may have two neighboring minority charge removal structures 301 surrounding it, or being separated only by a portion of the area of the top surface of the substrate 307, 510, without any intermediate structure between the minority charge removal structures 301 and its functionally linked minority detector structure 300.

In some embodiments, a minority charge removal structure 301 may be functionally linked, for example neighboring, one or more minority charge detection structures 300, but each minority charge detection structure 300 should be functionally linked to at least two minority charge removal structures 301. Thus, a single minority charge removal structure 301 may be shared by two minority charge detection structures 300.

In some embodiments, the minority charge removal structures 301 are placed as discrete islands between the minority charge detection structure 300 and the majority current sink 305, 405. This improves also speed, because charge carriers do not need to travel through the whole substrate towards the sink. For example, a single ring-shaped majority current sink 305 may surround the one or more minority charge detection structures and the two or more minority charge removal structures.

Figure 5A:
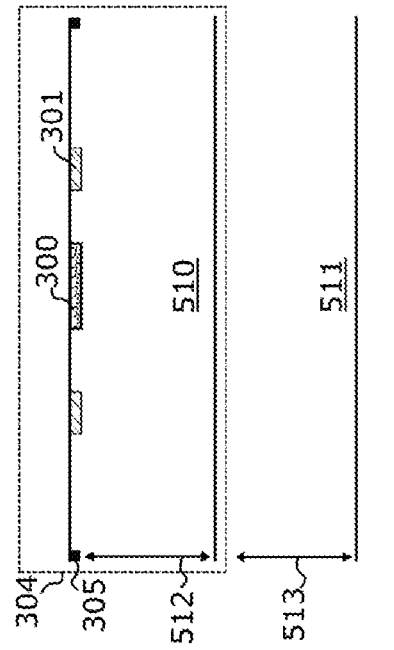
FIGS. 5A and 5B, show different substrate set-ups and light incidence sides for the structures according to embodiments of the present invention.

FIG. 5A shows how the detector 304 is supporting front side illumination (FSI) and back-side illumination (BSI). The detection volume in the p"-substrate 307 where the majority currents are flowing, can be illuminated with light incident from the top 501 or from the bottom 502 side. Photo-generated minority carriers will in both cases effectively be detected during a gating period.

Figure 5B:
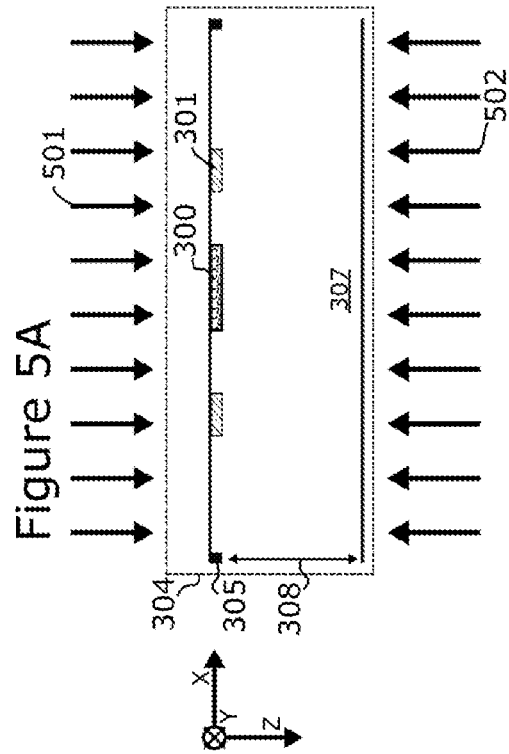

The p$^-$-substrate 307, 510 will in most situations be, however, quite thin, having a thickness 512 between a few microns and 30 micron, and may need mechanical support. A good FSI set-up is shown in FIG. 5B, whereby the p$^-$-substrate 510 can be on top of a thicker supporting substrate 511, having a thickness 513 sufficient to provide structural stability and strength. That thicker substrate 511 can for example be highly p-doped, as such also serving as a possible substrate majority current sink. This is an industrial set-up whereby production is started from a wafer with relative high conductivity of 20 Ω·cm, on which an e.g. an EPI layer of 15 micron is deposited having a low to very low conductivity of 800-2000 Ω·cm. Other options, including ones for BSI, using a stacked CMOS wafer can be considered by the person skilled in the art.

Figure 6A:
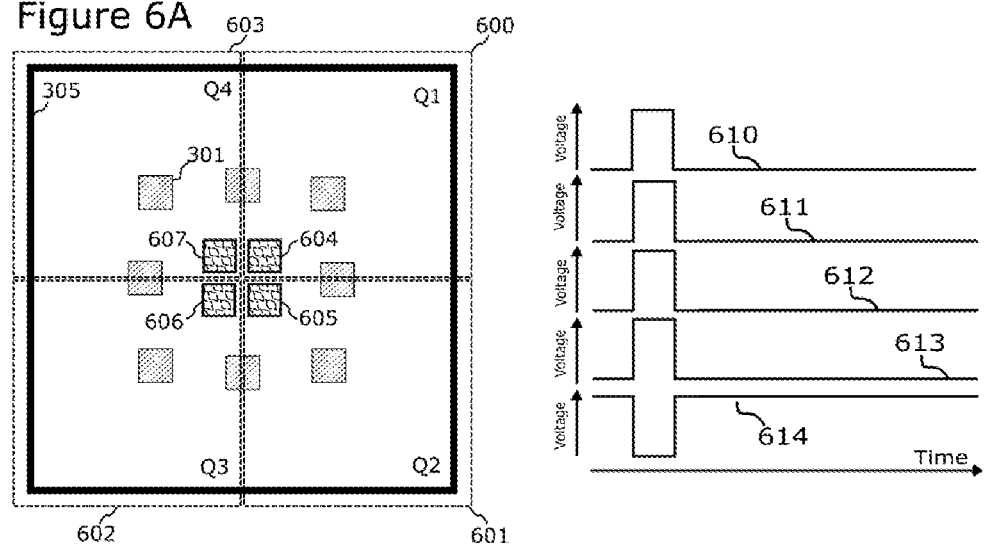
FIGS. 6A, 6B, and 6C show three use cases using multiple minority charge detection structures according to embodiments of the present invention.

FIG. 6A shows that within a single rectangle-shaped substrate majority current sink 305 four pixels 600, 601, 602, 603 can be grouped, each covering a quadrant Q1, Q2, Q3, Q4 of the space enclosed by the rectangle-shaped substrate majority current sink 305, thereby quadrupling the effective resolution of pixels of fast-gated detectors. Minority charge detection structures 604, 605, 606 and 607 each attract mainly the photo-generated minority charge carriers from their respective quadrant Q1, Q2, Q3, Q4 with little crosstalk. The curves 610 . . . 614 in the right hand part of FIG. 6A show how the voltages are applied to sample during the same time window. A high level is e.g. 3.3V, and low level is 0V, and the voltage at the rectangle-shaped substrate majority current sink 305 can be permanently at e.g. −5V. The curve 610 . . . 613 are the applied voltages to the four minority charge detection structures, 614 is the voltage applied to the 8 minority charge removal structures 301. The voltage on the minority charge removal structures can also be held constant.

Figure 6B:
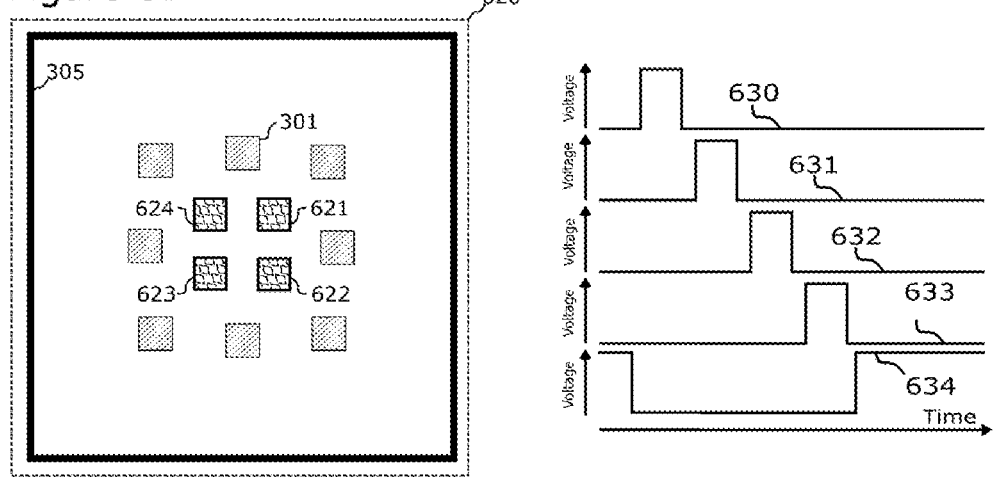

FIG. 6B has a very similar set-up; however, it is considered a single detection volume 620, whereby four minority charge detection structures 621, 622, 623 and 624 each attract mainly the photo generated minority charge carriers in different time windows. This is demonstrated by the applied voltages (and hitherto currents) 630, 631, 632 and 633 that gate at different consecutive periods in time. These periods can be overlapping, or non-overlapping. Curve 634 is the voltage applied to the 8 minority charge removal structures 301. The voltage on the minority charge removal structures can also be held constant.

Figure 6C:
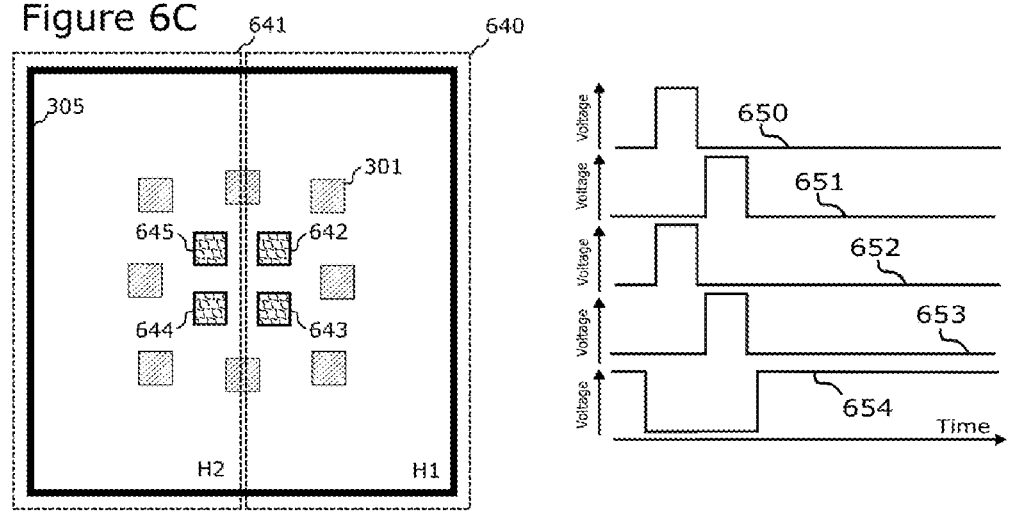

FIG. 6C shows a mixture of the principles explained in FIGS. 6A and 6B. Four minority charge detection structures 642, 643, 644 and 645 are provided, spread over two detection volumes 640, 641. Resolution doubles, and two separate time periods get sampled for each of the detectors 640 and 641. Minority charge detection structures 642, 643, 644 and 645 each attract mainly the photo-generated minority charge carriers from their respective halve H1, H2 with little crosstalk. The curves 650, 651, 652, 653 in the right hand part of FIG. 6C show how the voltages are applied to sample during the same time window. A high level is e.g. 3.3V, and low level is 0V, and the voltage at the rectangle-shaped substrate majority current sink 305 can be permanently at e.g. −5V. The curves 650, 651, 652, 653 are the applied voltages to the four minority charge detection structures, 654 is the voltage applied to the 8 minority charge removal structures 301. The voltage on the minority charge removal structures can also be held constant.

FIG. 7A shows how from an incident light signal 700 during a period defined by curve 701 the detection function can be turned ON, and the photo generated minority carriers can be integrated 702. FIG. 7B, shows how different slices of the incident light signal 700 can be integrated over the four minority charge detection structures 621, 622, 623 and 624 of detector 620 from FIG. 6B, in this way using four times more signal of the incident light and improving the signal to noise ratio by the same factor.

The light signal 700 can originate from different origins, e.g. from a fluorophore that has just been stimulated by a short light pulse.

The invention claimed is:

1. A detector device for detection of electromagnetic radiation impinging on a substrate, the impinging radiation generating pairs of majority and minority charge carriers in the substrate, the detector device comprising:
   at least one minority charge detection structure for detecting minority charge carriers generated in the substrate, and for, in a first mode, injecting a majority current so as to create an electric field for directing minority charge carriers towards the at least one minority charge detection structure for being detected;
   two or more minority charge removal structures per minority charge detection structure for draining away minority charge carriers, and for, in a second mode, injecting a majority current so as to create an electric field, for directing minority charge carriers towards the two or more minority charge removal structures, away from an associated charge detection structure; and
   at least one substrate majority charge current sink for extracting the injected majority current.

2. The detector device according to claim 1, wherein the at least one minority charge detection structure comprises:
   a doped region of a first conductivity type;
   a doped region of a second conductivity type different from the first conductivity type, the doped region of the second conductivity type being close to the doped region of the first conductivity type, and forming a pn junction with the substrate;
   the doped region of the first conductivity type being electrically contacted by a majority charge contact for injecting or extracting majority current in or from the substrate, so as to create an electric field for directing the minority charge carriers towards the doped region of the second conductivity type for readout of detected charge carriers.

3. The detector device according to claim 1, wherein the minority charge removal structures comprise:
   a doped region of a first conductivity type;
   a doped region of a second conductivity type different from the first conductivity type, the doped region of the second conductivity type being close to the doped region of the first conductivity type, and forming a pn junction with the substrate; and
   a common terminal short-circuiting the formed pn junction.

4. The detector device according to claim 3, wherein the common terminal comprises a common contact to the doped region of the first conductivity type and to the doped region of the second conductivity type.

5. The detector device according to claim 1, wherein the at least one substrate majority charge current sink comprises a single conductive structure surrounding the at least one minority charge detection structure and the two or more minority charge removal structures.

6. The detector device according to claim 1, wherein the at least one minority charge detection structure and the two or more minority charge removal structures are provided at a top surface of the detector device, and at least one substrate majority charge current sink comprises a conductive structure at a bottom of the detector device opposite to the top surface.

7. The detector device according to claim 1, comprising a plurality of minority charge detection structures and a plurality of minority charge removal structures.

8. The detector device according to claim 7, wherein at least two of the plurality of minority charge detection structures share at least one of the minority charge removal structures.

9. The detector device according to claim 1, wherein the minority charge removal structures are each separated from the at least one minority charge detection structure by a portion of the substrate.

10. The detector device according to claim 1, wherein the minority charge removal structures comprise discrete islands around the at least one minority charge detection structure.

11. The detector device according to claim 1, wherein the at least one minority charge detection structure is functionally linked to at least two of said two or more minority charge removal structures.

12. The detector device according to claim 1, wherein one of the minority charge removal structures is located at an opposite side of the at least one minority charge detection structure relative to another of the minority charge removal structures.

13. A detector device for detection of electromagnetic radiation impinging on a substrate, the impinging radiation generating pairs of majority and minority charge carriers in the substrate, the detector device comprising:
   at least one minority charge detection structure for detecting minority charge carriers generated in the substrate, and for, in a first mode, injecting a majority current so as to create an electric field for directing minority charge carriers towards the at least one minority charge detection structure for being detected;

two or more minority charge removal structures per minority charge detection structure for draining away minority charge carriers, and for, in a second mode, injecting a majority current so as to create an electric field, for directing minority charge carriers towards the two or more minority charge removal structures, away from an associated charge detection structure; and at least one substrate majority charge current sink for extracting the injected majority current;

wherein the at least one minority charge detection structure and the two or more minority charge removal structures are provided at a top surface of the detector device, and at least one substrate majority charge current sink comprises a conductive structure at a bottom of the detector device opposite to the top surface.

\* \* \* \* \*